(12) United States Patent
Rankin et al.

(10) Patent No.: US 7,745,069 B2
(45) Date of Patent: Jun. 29, 2010

(54) STRUCTURE AND METHODOLOGY FOR FABRICATION AND INSPECTION OF PHOTOMASKS

(75) Inventors: Jed H. Rankin, Richmond, VT (US); Andrew J. Watts, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 11/619,323

(22) Filed: Jan. 3, 2007

(65) Prior Publication Data
US 2007/0105024 A1 May 10, 2007

Related U.S. Application Data

(62) Division of application No. 10/908,284, filed on May 5, 2005, now Pat. No. 7,200,257.

(51) Int. Cl.
*G03F 1/00* (2006.01)
(52) U.S. Cl. .......................... 430/5; 382/144
(58) Field of Classification Search ...................... 430/5, 430/22, 30; 382/144; 716/19, 21
See application file for complete search history.

(56) References Cited

U.S. PATENT DOCUMENTS

| | | | | |
|---|---|---|---|---|
| 4,603,974 A | | 8/1986 | Matsui | |
| 5,723,236 A | * | 3/1998 | Inoue et al. | 430/5 |
| 5,789,120 A | * | 8/1998 | Jang et al. | 430/5 |
| 6,001,512 A | * | 12/1999 | Tzu et al. | 430/5 |
| 6,436,589 B1 | | 8/2002 | Smith | |
| 6,485,869 B2 | | 11/2002 | Tsai et al. | |
| 6,515,495 B2 | | 2/2003 | Richter | |
| 2001/0033976 A1 | * | 10/2001 | Soenosawa | 430/5 |
| 2002/0071993 A1 | | 6/2002 | Smith | |
| 2002/0103607 A1 | | 8/2002 | Crell | |
| 2003/0039928 A1 | | 2/2003 | Bollinger et al. | |
| 2003/0048939 A1 | | 3/2003 | Lehman | |
| 2004/0066963 A1 | | 4/2004 | Hechtl et al. | |
| 2005/0095509 A1 | | 5/2005 | Zhang et al. | |

* cited by examiner

*Primary Examiner*—Mark F Huff
*Assistant Examiner*—Stewart A Fraser
(74) *Attorney, Agent, or Firm*—Schmeiser, Olsen & Watts; Richard M. Kotulak

(57) ABSTRACT

A photomask, method of designing, of fabricating, of designing, a method of inspecting and a system for designing the photomask. The photomask, includes: a cell region, the cell region comprising one or more chip regions, each chip region comprising a pattern of opaque and clear sub-regions corresponding to features of an integrated circuit chip and one or more kerf regions, each kerf region comprising a pattern of opaque and clear sub-regions corresponding to features of an integrated circuit kerf; a clear region formed adjacent to a side of a copy region, the copy region comprising opaque and clear sub-regions that are copies of at least a part of the cell region; and an opaque region between the clear region and the cell region.

26 Claims, 8 Drawing Sheets

STRUCTURE AND METHODOLOGY FOR FABRICATION AND INSPECTION OF PHOTOMASKS

RELATED APPLICATIONS

This Application is a division of co-pending application Ser. No. 10/908,284.

FIELD OF THE INVENTION

The present invention relates to the field of photomasks; more specifically, it relates to structures for photomasks and methodologies for fabrication and inspection of photomasks.

BACKGROUND OF THE INVENTION

As the density of integrated circuit chips increase and the physical image sizes decrease, defect inspection of the photomasks used to fabricate integrated circuit chips has become ever more important. These images have become far too small and numerous for human visual inspection and verification. Therefore machine inspection methods have developed. However, there are regions on photomasks that are printed on wafers during manufacture of integrated circuit chips that repeat and other regions that do not repeat. Inspection of repeating images and of non-repeating images require different machine methods of inspection. Implementing two machine methods in a mask manufacturing facility can be expensive and time consuming.

Therefore, there is a need for a single machine methodology for inspecting photomasks having regions that repeat and regions that do not repeat.

SUMMARY OF THE INVENTION

The present invention places copies of clear and opaque regions within the cell region of a photomask within clear bar regions of the photomask. The clear bars are disposed within an opaque frame that surrounds the cell region. The copies clear and opaque regions can then be compared to the corresponding clear and opaque regions in the cell region.

A first aspect of the present invention is a photomask, comprising: a cell region, the cell region comprising one or more chip regions, each chip region comprising a pattern of opaque and clear sub-regions corresponding to features of an integrated circuit chip and one or more kerf regions, each kerf region comprising a pattern of opaque and clear sub-regions corresponding to features of an integrated circuit kerf; a clear region formed adjacent to a side of a copy region, the copy region comprising opaque and clear sub-regions that are copies of at least a part of the cell region; and an opaque region between the clear region and the cell region.

A second aspect of the present invention is a method of inspecting a photomask, comprising: providing the photomask, the photomask comprising: a cell region, the cell region comprising one or more chip regions, each chip region comprising a pattern of opaque and clear sub-regions corresponding to features of an integrated circuit chip and one or more kerf regions, each kerf region comprising a pattern of opaque and clear sub-regions corresponding to features of an integrated circuit kerf; a clear region formed adjacent to a side of a copy region, the copy region comprising opaque and clear sub-regions that are copies of at least a part of the cell region; and an opaque region between the clear region and the cell region; performing an image scan of the copy region; performing an image scan of a portion of the cell region corresponding to the copy region; performing a comparison comprising a comparing of the image scan of the copy region and the image scan of the corresponding portion of the cell region; and determining locations of potential defects in the corresponding portion of the cell region based on the comparison or both determining the locations of potential defects in the corresponding portion of the cell region and determining corresponding locations of potential defects in the copy region based on the comparison.

A third aspect of the present invention is a method of designing a photomask, comprising: generating a chip dataset representing an integrated circuit chip design to be included in a cell region of the photomask; generating a kerf dataset representing a kerf design to be included in the cell region; determining a portion of the kerf dataset to copy; generating a kerf copy dataset, the kerf copy dataset including the portion of the kerf dataset to copy; merging the chip dataset, the kerf dataset and the kerf copy dataset into a photomask dataset representing a pattern of clear and opaque regions of the photomask.

A fourth aspect of the present invention is a computer system comprising a processor, an address/data bus coupled to the processor, and a computer-readable memory unit coupled to communicate with the processor, the memory unit containing instructions that when executed implement a method for method of designing a photomask, the method comprising the computer implemented steps of: generating a chip dataset representing an integrated circuit chip design to be included in a cell region of the photomask; generating a kerf dataset representing a kerf design to be included in the cell region; determining a portion of the kerf dataset to copy; generating a kerf copy dataset, the kerf copy dataset including the portion of the kerf dataset to copy; merging the chip dataset, the kerf dataset and the kerf copy dataset into a photomask dataset representing a pattern of clear and opaque regions of the photomask.

A fifth aspect of the present invention is a method of fabricating a photomask, comprising: providing a transparent substrate having an opaque coating; forming a cell region by removing first areas of the opaque coating, the cell region comprising one or more chip regions and one or more kerf regions; forming a copy region by removing second areas of the opaque coating, the copy region comprising a copy of a part of the cell region; forming a clear region by completely removing third areas of the opaque coating; and wherein the clear region is formed between a side of the substrate and a side of the cell region and separated from the cell region by an opaque region and wherein a sub-region of the clear region separates the copy region from the opaque region.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
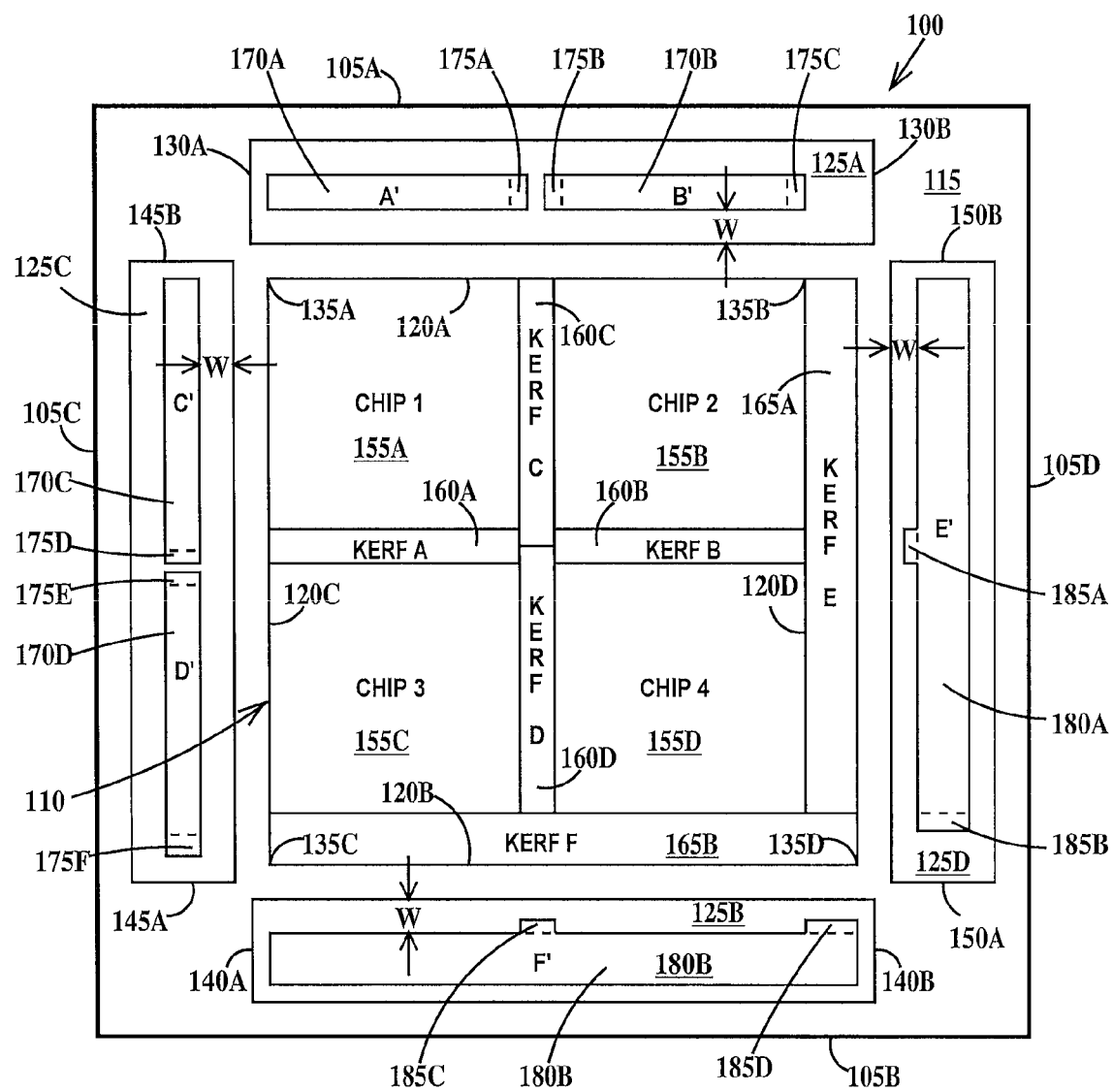
FIG. 1 is a top view of an exemplary photomask illustrating a first embodiment of the present invention.

The present invention is applicable to conventional photomasks fabricated from a transparent substrate, for example glass, quartz, or other materials on which a opaque layer has been formed, for example a layer of chrome or a dual layer of chrome over molybdenum. The present invention is also applicable to phase shift masks in which notches have been formed to thin the transparent substrate are immediately adjacent to the edges of opaque features. The present invention is further applicable to "chromeless" masks having no "opaque" coating but rather regions of the substrate with zero radian phase shifts and regions of π or –π in phase shifts. It should be understood that the phase shift of a layer is a function of thickness and that the intensity of electromagnetic radiation passing through a layer is proportional to the second power of the phase (in radians).

For conventional photomasks, clear regions are formed by removal of the opaque layer by a photolithographic process. In one example, a photoresist layer is applied to mask blank (a transparent substrate having a continuous opaque layer), a pattern is exposed into the photoresist by a mask-writing tool, such as an electron beam tool driven by a dataset (described infra), the photoresist developed, the opaque layer etched away (for example by a reactive ion etch process) where it is exposed by the development process and then the remaining photoresist layer removed leaving a patterned region which comprises opaque sub-regions and clear areas sub-regions.

For phase shift, or other advanced types of masks, an additional photolithographic process may be used form the notches in the "transparent" substrate. For "chromeless" phase shift masks a single photolithographic process may be used form a pattern of thin and thick regions in the "transparent" substrate It should be understood that the term transparent means light of the wavelength used by the exposure tool using the photomask in a integrated circuit chip manufacturing line will pass through the substrate un-attenuated to the degree that a positive photoresist layer on a wafer in the exposure tool will be exposed sufficiently to be removed by a chemical development process. Clear regions are thus transparent. Opaque regions will attenuate or completely block light of the wavelength used by the exposure tool using the photomask in a integrated circuit chip manufacturing line to the degree that a positive photoresist layer on a wafer in the exposure tool will not be exposed sufficiently to be removed by the development process. A positive photoresist is a photoresist that is de-polymerized when exposed to actinic radiation.

By these definitions all masks have clear and opaque regions.

It should be further understood, that a photomask contains a cell region comprising one or more chip regions and one or more kerf regions. The chip regions are comprised of a pattern of opaque and clear sub-regions corresponding to features of an integrated circuit chip (at a particular level of build of the integrated circuit chip). Each kerf region is comprised of a pattern of opaque and clear sub-regions corresponding to features of an integrated circuit kerf chip (at the particular level of build of the integrated circuit chip).

Kerfs comprise a dicing channel filled with structures that are used for physical and/or electrical image measurements, device parametric measurements and alignment marks (images that allow a current mask to be aligned to pattern on the wafer formed by an earlier used mask), alignment measurement structures, and other non-chip integrated circuit chip structures. Kerfs are also known in the art as streets or scribe lines.

In a photolithographic process of an integrated circuit manufacturing line, the pattern of opaque and clear sub-regions of the cell region will be transferred into a photoresist layer on a semiconductor wafer during fabrication of a level of an integrated circuit chip.

FIG. 1 is a top view of an exemplary photomask illustrating a first embodiment of the present invention. In FIG. 1, a rectangular photomask 100 has opposing parallel first second sides 105A and 105B and opposing parallel third and fourth sides 105C and 105D. Photomask 100 includes a cell region 110 and an opaque frame region 115 completely surrounding a rectangular cell region 110. Cell region 110 has opposing parallel first and second sides 120A and 120B and opposing parallel third and fourth sides 120C and 120D. First, second, third and fourth sides 105A, 105B, 105C and 105D of photomask 100 are parallel to first, second, third and fourth sides 120A, 120B, 120C and 120D of cell region 110 respectively.

Disposed between first side 105A of photomask 100 and first side 120A of cell region 110 and contained completely within frame region 115 is a first rectangular clear region, hereafter first clear bar 125A. First clear bar 125A has a length measured in a direction parallel to first side 120A of cell region 110 that is longer than a length of first side 120A of cell region 110. A first end 130A of first clear bar 125A extends past a first corner 135A of cell region 110 formed by the intersection of first and third sides 120A and 120C of cell region 110. A second end 130B of first clear bar 125A extends past a second corner 135B of cell region 110 formed by the intersection of first and fourth sides 120A and 120D of cell region 110.

Disposed between second side 105B of photomask 100 and second side 120B of cell region 110 and contained completely within frame region 115 is a second rectangular clear region, hereafter second clear bar 125B. Second clear bar 125B has a length measured in a direction parallel to second side 120B of cell region 110 that is longer than a length of second side 120B of cell region 110. A first end 140A of second clear bar 125B extends past a third corner 135C of cell region 110 formed by the intersection of second and third sides 120B and 120C of cell region 110. A second end 140B of second clear bar 125B extends past a fourth corner 135D of cell region 110 formed by the intersection of second and fourth sides 120B and 120D of cell region 110.

Disposed between third side 105C of photomask 100 and third side 120C of cell region 110 and contained completely within frame region 115 is a third rectangular clear region, hereafter third clear bar 125C. Third clear bar 125C has a length measured in a direction parallel to third side 120C of cell region 110 that is longer than a length of third side 120C of cell region 110. A first end 145A of third clear bar 125C extends past third corner 135C of cell region 110. A second end 145B of third clear bar 125B extends past first corner 135A of cell region 110.

Disposed between fourth side 105D of photomask 100 and fourth side 120D of cell region 110 and contained completely within frame region 115 is a fourth rectangular clear region, hereafter fourth clear bar 125D. Fourth clear bar 125D has a length measured in a direction parallel to fourth side 120D of cell region 110 that is longer than a length of fourth side 120D of cell region 110. A first end 150A of fourth clear bar 125D extends past fourth corner 135D of cell region 110. A second end 150B of fourth clear bar 125D extends past second corner 135B of cell region 110.

Cell region 110 includes first, second, third and fourth chip (or die) regions 155A, 155B, 155C and 155D, first, second, third and fourth interstitial kerf regions 160A, 160B, 160C and 160D and first and second peripheral kerf regions 165A and 165B. First, second, third and fourth chip regions 155A, 155B, 155C and 155D, first, second, third and fourth interstitial kerf regions 160A, 160B, 160C and 160D and first and second peripheral kerf regions 165A and 165B are each comprised of a pattern of opaque and transparent regions. Interstitial kerfs are kerf regions that are disposed between two different chip regions and peripheral kerf regions are kerf regions disposed between a chip region and an side of a cell region.

In a photolithographic process of an integrated circuit manufacturing line, first, second, third and fourth chip regions 155A, 155B, 155C and 155D and first, second, third and fourth interstitial kerf regions 160A, 160B, 160C and 160D and first and second peripheral kerf regions 165A and 165B will define the various images formed in a photoresist layer on a semiconductor wafer for a fabrication level of integrated circuit chip.

First clear bar 125A contains a first and a second interstitial kerf copy regions 170A and 170B. First interstitial kerf copy region 170A includes all the patterns of first interstitial kerf region 160A plus an extension 175A which includes at least portions of those patterns from adjacent regions of third and fourth first interstitial kerf regions 160C and 160D that extend into first interstitial kerf region 160A. Second interstitial kerf copy region 170B includes all the patterns of second interstitial kerf region 160B plus a first extension 175B which includes at least portions of those patterns from adjacent regions of third and fourth interstitial kerf regions 160C and 160D that extend into second interstitial kerf region 160B and a second extension 175C which includes at least portions of those patterns from adjacent regions of first peripheral kerf region 165A that extend into second interstitial kerf region 160B. It should be noted that first and a second interstitial kerf copy regions 170A and 170B are located within first clear bar 125A so there is always a continuous clear band of first clear bar 125A containing no opaque shapes surrounding interstitial kerf copy regions 170A and 170B.

Third clear bar 125C contains a third and a fourth interstitial kerf copy regions 170C and 170D. Third interstitial kerf copy region 170C contains all the patterns of first interstitial kerf region 160C plus an extension 175D which includes at least portions of those patterns from adjacent regions of fourth interstitial kerf region 160D that extend into first interstitial kerf region 160C. Fourth interstitial kerf copy region 170D includes all the patterns of fourth interstitial kerf region 160D plus a first extension 175E which includes at least portions of those patterns from adjacent regions of third interstitial kerf region 160C that extend into second interstitial kerf region 160B and a second extension 175FC which includes at least portions of those patterns from adjacent regions of second peripheral kerf region 165B that extend into fourth interstitial kerf region 160D. It should be noted that third and a fourth interstitial kerf copy regions 170C and 170D are located within third clear bar 125C so there is always a continuous clear band of first clear bar 125C containing no opaque shapes surrounding interstitial kerf copy regions 170C and 170D.

Fourth clear bar 125D contains a first peripheral kerf copy region 180A. First peripheral kerf copy region 180A includes all the patterns of first peripheral kerf region 165A plus a first extension 185A which includes at least portions of those patterns from adjacent regions of second interstitial kerf region 160B that extend into first peripheral kerf region 165A and a second extension 185B which includes at least portions of those patterns from adjacent regions of second peripheral kerf region 165B that extend into first peripheral kerf region 165B. It should be noted that first peripheral kerf copy region 180A is located within fourth clear bar 125D so there is always a continuous clear band of fourth clear bar 125D containing no opaque shapes surrounding first peripheral kerf copy region 180A.

Second clear bar 125B contains a second peripheral kerf copy region 180B. Second peripheral kerf copy region 180B includes all the patterns of second peripheral kerf region 165B plus a first extension 185C which includes at least portions of those patterns from adjacent regions of fourth interstitial kerf region 160DB that extend into second peripheral kerf region 165B and a second extension 185D which includes at least portions of those patterns from adjacent regions of first peripheral kerf region 165A that extend into second peripheral kerf region 165B. It should be noted that second peripheral kerf copy region 180B is located within second clear bar 125B so there is always a continuous clear band of second clear bar 125B containing no opaque shapes surrounding second peripheral kerf copy region 180B.

It has been noted that there is a continuous clear band of clear bar surrounds any copy regions within the clear bar. One use of clear bars is to modify the abrupt transition from the cell region which can be, for example 70% clear area and 30% opaque area to the frame which is 100% opaque area. With clear bars, the transition becomes, for example, from 70% clear area and 30% opaque area to 100% opaque area to 100% clear area which has the effect of improving image size control during the photomask manufacturing process. There is a minimum width W of this continuous clear band below which, while the present invention is operable, the beneficial effect on image size control during photomask manufacture is lost.

In a photolithographic process of an integrated circuit manufacturing line, the patterns of first, second, third and fourth interstitial kerf copy regions 170A, 170B, 170C and 170D and first and second peripheral kerf copy regions 180A and 180B not will be transferred to a wafer. Shutter blades of the photolithographic exposure tool of the integrated circuit chip manufacturing line will cover all of clear bars 125A, 125B, 125C and 125D. The shutter blades will overlap regions of the opaque frame 115 between cell region 110 and clear bars 125A, 125B, 125C and 125D.

In one example, chip regions 155A, 155B, 155C and 155D have identical clear and opaque patterns, i. e. are identical designs. In a second example, a first pair of two of chip regions 155A, 155B, 155C and 155D are identical to each other and a second pair having different chip regions from the first pair are identical to each other.

Figure 6:
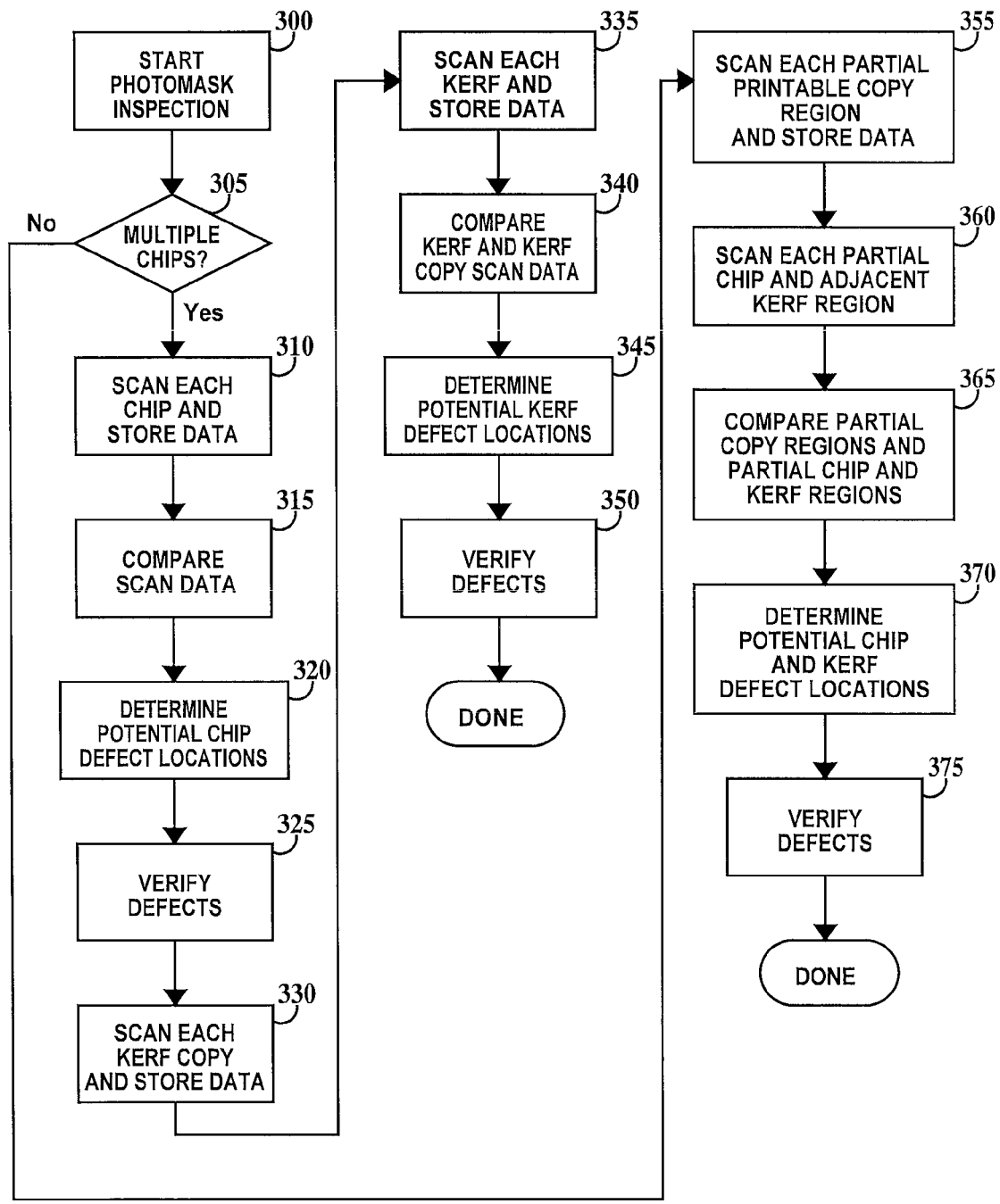
FIG. 6 is a flowchart illustrating a method of inspecting a photomask according to the present invention.

By having sets of chips that identical, machine defect inspection of chip regions by comparison of scanned image data from each chip region can be performed. By having interstitial kerf regions and copies of the interstitial kerf regions (located in the clear bars), machine defect inspection by comparison of scanned image data from each unique interstitial kerf region can be compared to scanned image data of a corresponding copy (as illustrated in FIG. 6 and described infra). Similarly, by having peripheral kerf regions and copies of the peripheral kerf regions (located in the clear bars), machine defect inspection by comparison of scanned image data from each unique peripheral kerf region can be compared to scanned image data of a corresponding copy (as illustrated in FIG. 6 and described infra). It should be understood, that a potential defect is flagged when the scanned image data from corresponding regions of different but identical structures do not match.

It should also be noted, that if two or more interstitial or two or more peripheral kerfs are identical, it becomes optional to include any copies of the non-unique interstitial peripheral kerfs in the clear bar regions. However, reasons for including copies of the non-unique interstitial peripheral kerfs in the clear bar regions is discussed infra.

While four chips and six unique kerfs are illustrated in FIG. 1, the first embodiment of the present invention is equally applicable to photomasks having at least a pair of identical chips and at least one unique kerf or at the very least having at least one unique kerf.

Interstitial kerf region 160A and 160B may comprise a single kerf region in which case adjustments to interstitial kerf copy regions 170A and 170B will be required or interstitial kerf regions 160C and 160D may comprise a single kerf region in which case adjustments to interstitial kerf copy regions 170C and 170D will be required.

The present invention allows unique kerf photomasks to be inspected by comparing kerf scanned image data to kerf copy scanned image data. Applicants have seen about a 30% improvement in defect detection reliability using scanned image data to scanned image data comparison over scanned image data to dataset synthesized image data comparison.

While four individual clear bar regions have been illustrated several other options exist. First, two adjacent clear bars may be joined together in an "L" shaped configuration. Second, a first of two adjacent clear bars may be joined together in a first "L" shaped configuration and the remaining two clear bars may be joined together in a second "L" shaped configuration. Third, three clear bars may be joined together in a "U" shaped configuration. Fourth, all four clear bars may be joined together in a ring shaped configuration. In all four options, a continuous opaque will exist between the cell region of the photomask and the clear bars.

Figure 2:
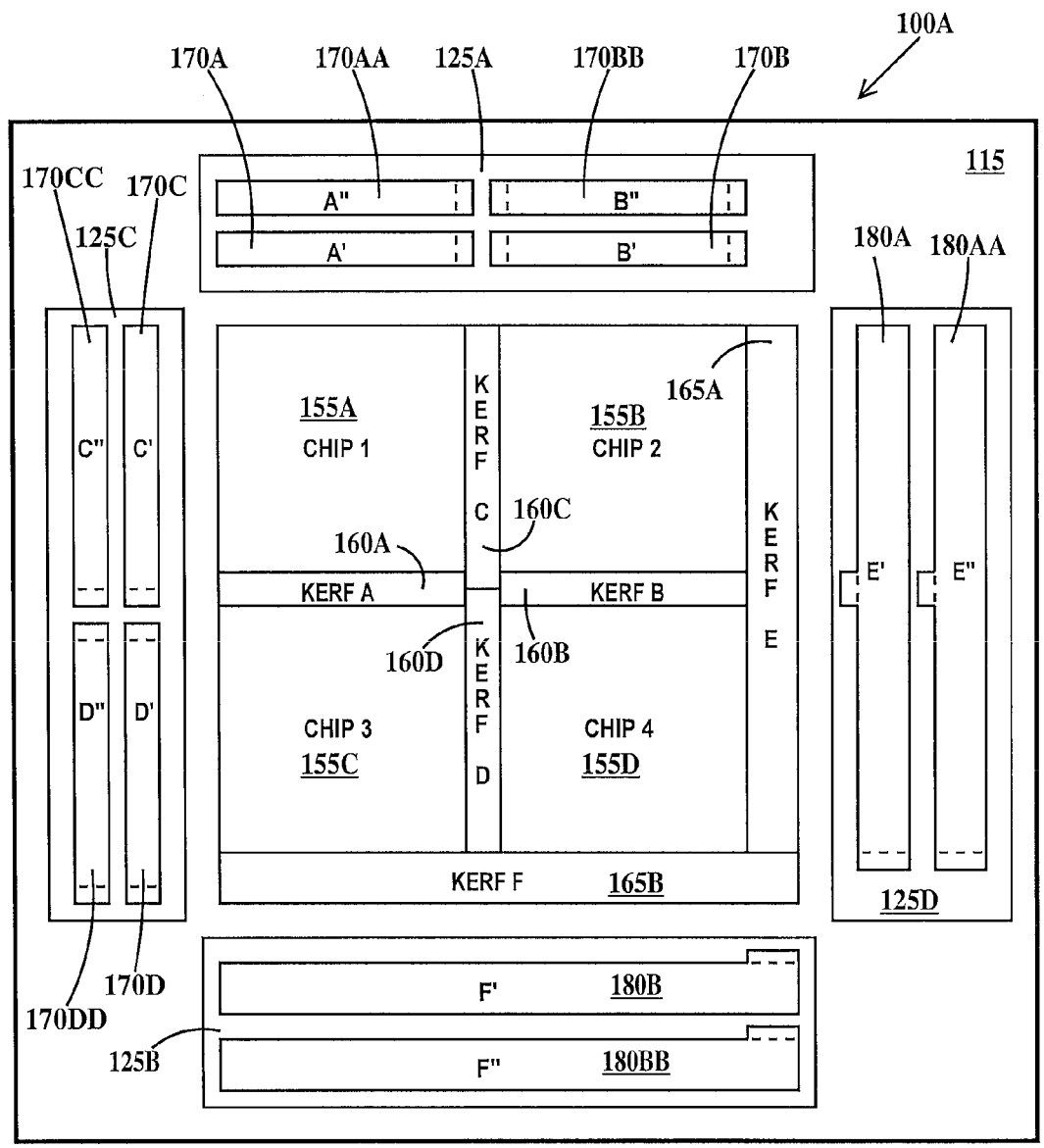
FIG. 2 is a top view of an exemplary photomask illustrating a second embodiment of the present invention.

FIG. 2 is a top view of an exemplary photomask illustrating a second embodiment of the present invention. In FIG. 2, a photomask 100A is similar to photomask 100 of FIG. 1, except for the following four differences:

First, first clear bar 125A contains in addition to first and second interstitial kerf copy regions 170A and 170B, third and fourth interstitial kerf copy regions 170AA and 170BB where third interstitial kerf copy region 170AA is identical to first interstitial kerf copy region 170A and fourth interstitial kerf copy region 170BB is identical to second interstitial kerf copy region 170B.

Second, second clear bar 125B contains in addition to second peripheral kerf copy region 180B a third peripheral kerf copy region 180BB where third peripheral kerf copy region 180BB is identical to second peripheral kerf copy region 180B.

Third, third clear bar 125C contains in addition to first and second interstitial kerf copy regions 170C and 170C, third and fourth interstitial kerf copy regions 170CC and 170DD where third interstitial kerf copy region 170CC is identical to first interstitial kerf copy region 170C and fourth interstitial kerf copy region 170DD is identical to second interstitial kerf copy region 170D.

Fourth, fourth clear bar 125D contains in addition to first peripheral kerf copy region 180A a fourth peripheral kerf copy region 180AA where fourth peripheral kerf copy region 180AA is identical to first peripheral kerf copy region 180A.

The duplicate copies of each interstitial kerf copy region and each peripheral kerf copy region significantly increases the probability of determining if a potential defect detected lies in a kerf copy region or a kerf region of the cell region. As mentioned supra, a potential defect is flagged when the data from corresponding regions of identical structures do not match. If there are three identical regions and one does not match, there is a high probability that the defect lies in the region that does not match the other two.

While four chips and six unique kerfs are illustrated in FIG. 2, the second embodiment of the present invention is equally applicable to photomasks having at least a pair of identical chips and at least one unique kerf or at the very least having at least one unique kerf.

Figure 3:
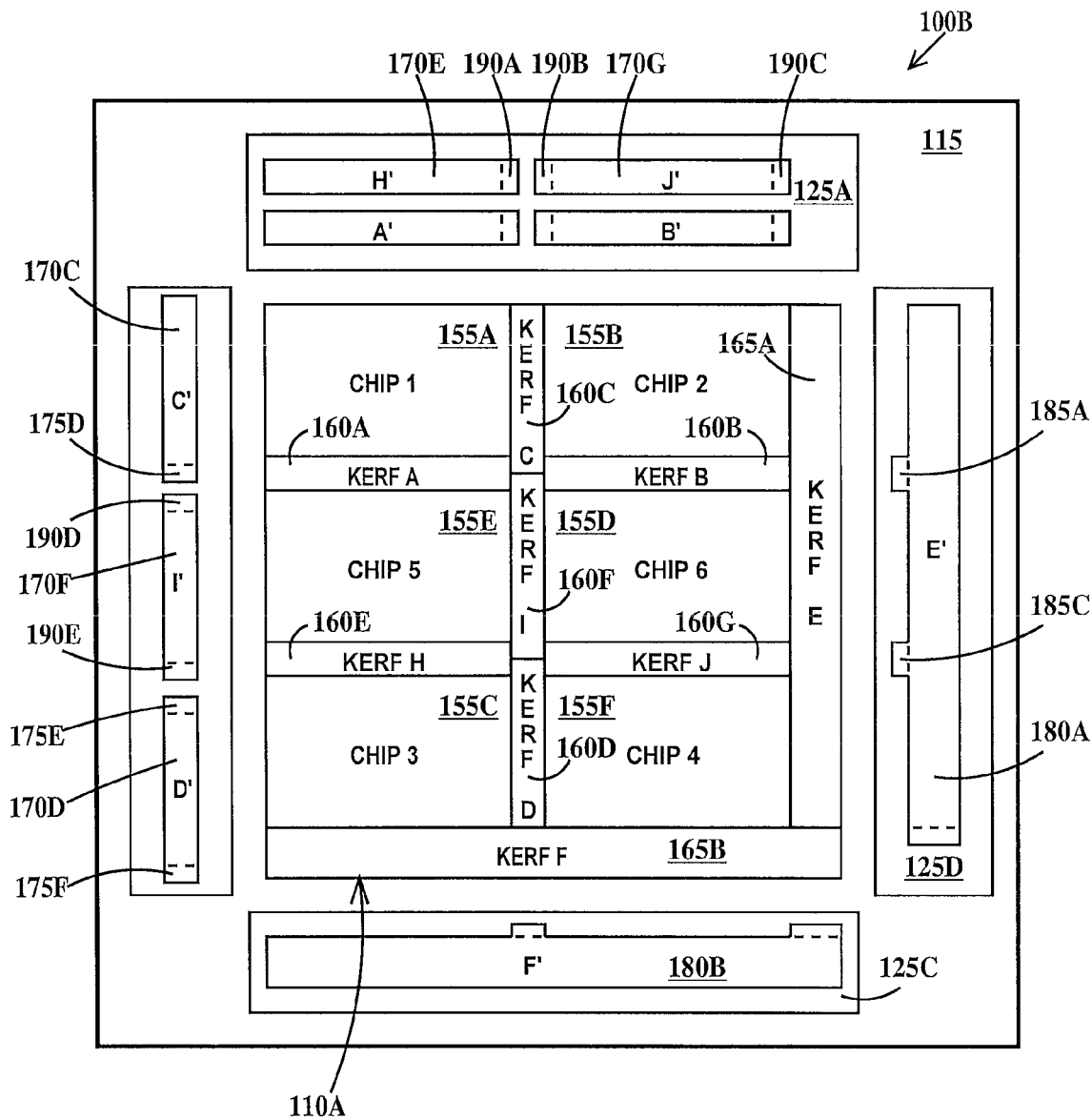
FIG. 3 is a top view of an exemplary photomask illustrating a third embodiment of the present invention.

FIG. 3 is a top view of an exemplary photomask illustrating a third embodiment of the present invention. In FIG. 3, a photomask 100B is similar to photomask 100 of FIG. 1, except for the following four differences:

First, a cell region 110A includes fifth and sixth chip regions 155E and 155F in addition to first, second, third and fourth chip regions 155A, 155B, 155C and 155D as well as fifth, sixth and seventh interstitial kerf regions 160E, 160F and 160G in addition to first, second, third and fourth interstitial kerf regions 160A, 160B, 160C and 160D.

Second, first clear bar 125A contains in addition to first and second interstitial kerf copy regions 170A and 170B, fifth and seventh interstitial kerf copy regions 170E and 170G. Fifth interstitial kerf copy region 170E includes all the patterns of fifth interstitial kerf region 165E plus a first extension 190A which includes at least portions of those patterns from adjacent regions of fourth interstitial kerf region 160D and sixth interstitial kerf region 160F that extend into fifth peripheral kerf region 165E. Seventh interstitial kerf copy region 170G includes all the patterns of seventh interstitial kerf region 165G plus a first extension 190B which includes at least portions of those patterns from adjacent regions of fourth interstitial kerf region 160D and sixth interstitial kerf region 160F that extend into seventh interstitial kerf region 160G and a second extension 190C which includes at least portions of those patterns from adjacent regions of first peripheral kerf region 165A that extend into seventh interstitial kerf region 160G.

Third, third clear bar 125C contains in addition to third and fourth interstitial kerf copy regions 170C and 170D, fifth interstitial kerf copy region 170F. Sixth interstitial kerf copy region 170F includes all the patterns of sixth interstitial kerf region 165F plus a first extension 190D which includes at least portions of those patterns from adjacent regions of third interstitial kerf region 160C that extend into sixth interstitial kerf region 160F and a second extension 190E which includes at least portions of those patterns from adjacent regions of fourth interstitial kerf region 160D that extend into sixth interstitial kerf region 160F. Additionally, third interstitial kerf copy region 170C is modified so extension 175D includes patterns of sixth interstitial kerf region 165F (instead of fourth interstitial kerf region 160D) that extend into sixth interstitial kerf region 160F and fourth interstitial kerf copy region 170D is modified so first extension 175E includes patterns of sixth interstitial kerf region 165F (instead of third interstitial kerf region 160C) that extend into sixth interstitial kerf region 160F.

Fourth, first peripheral kerf copy region 180A further includes a third extension 185C which includes at least portions of those patterns from adjacent regions of seventh interstitial kerf region 160G that extend into first peripheral kerf region 165A.

Figure 4:
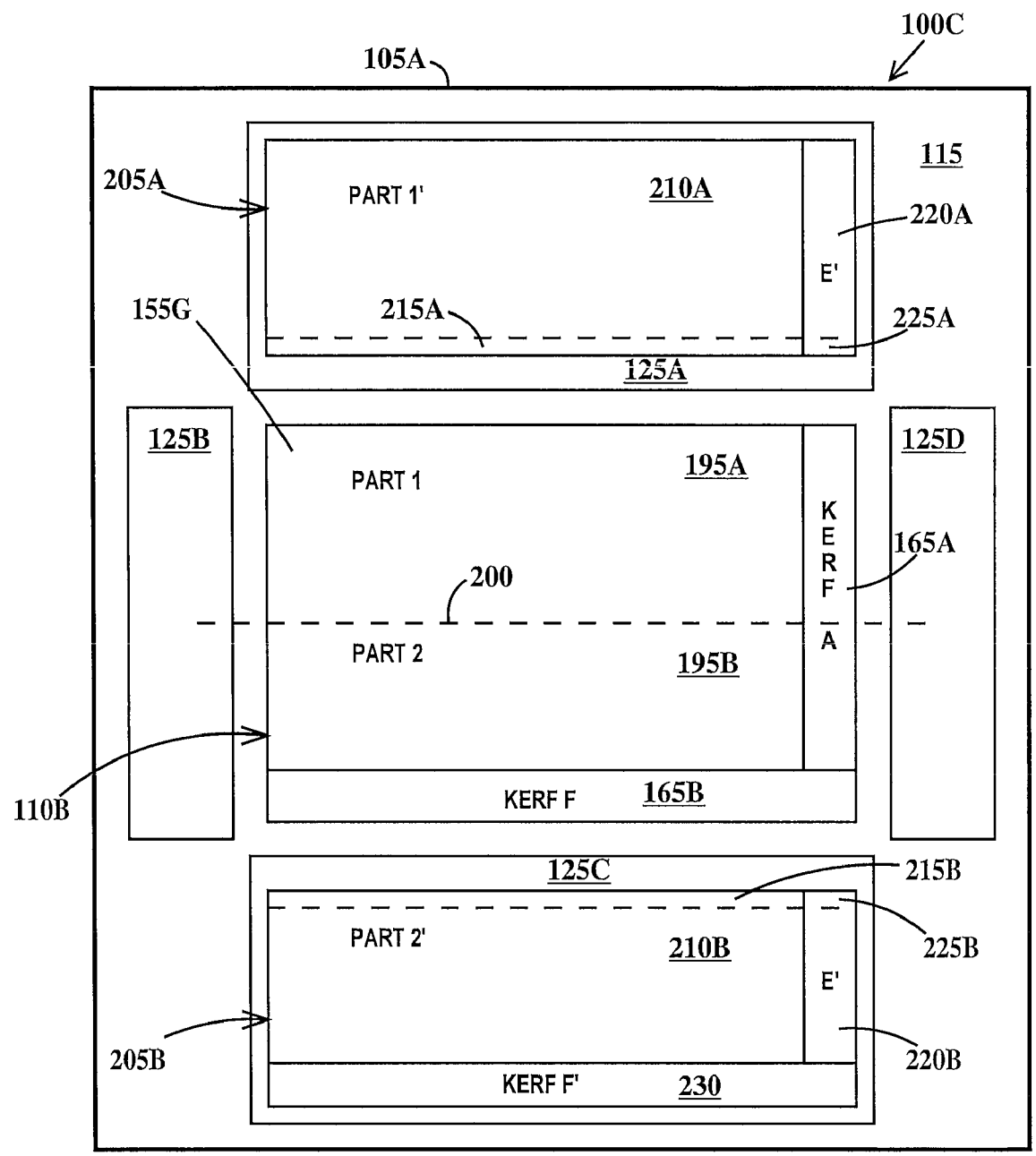
FIG. 4 is a top view of an exemplary photomask illustrating cording a fourth embodiment of the present invention.

FIG. 4 is a top view of an exemplary photomask illustrating a fourth embodiment of the present invention. In FIG. 4, a photomask 100C is similar to photomask 100 of FIG. 1, except for the following four differences:

First, a cell region 110B includes only a single chip region 155G instead of four chip regions, 155A, 155B, 155C and 155D as in FIG. 1 and there are no interstitial kerf regions. Chip region 155G is divided into first and second partial chip regions 195A and 195B by an axis 200 parallel to side 105A of photomask 100C.

Second, first clear bar 125A contains a first partial copy region 205A instead of first and second interstitial kerf copy regions 170A and 170B (see FIG. 1). First partial copy region 205A includes a first partial chip copy region 210A which includes all the patterns of first partial chip region 195A, a first extension region 215A which includes at least portions of those patterns from adjacent regions of second partial chip region 195B that extend into first partial chip region 195A, a first peripheral kerf copy region 220A which includes at least portions of those patterns from the portion of first peripheral kerf 165A adjacent to first chip partial region 195A, and a second extension region 225A which includes at least portions of those patterns from the portion of first peripheral kerf 165A that overlap axis 200.

Third, second clear bar 125B contains a second partial copy region 205B instead of second peripheral kerf copy regions 180B (see FIG. 1). Second partial copy region 205B includes a second partial chip copy region 210B which includes all the patterns of second partial chip region 195B, a first extension region 215B which includes at least portions of those patterns from adjacent regions of first partial chip region 195A that extend into second partial chip region 195BA, a second peripheral kerf copy region 220B which includes at least portions of those patterns from the portion of first peripheral kerf 165A adjacent to second chip partial region 195B, a second extension region 225B which includes at least portions of those patterns from the portion of first peripheral kerf 165A that overlap axis 200, and third peripheral kerf copy region 230 that includes all the patterns of second peripheral kerf 165B.

Fourth, clear bars 125B and 125D are empty, that is they contain no opaque regions.

The present invention allows unique kerf photomasks to be inspected by comparing kerf scanned image data to kerf copy scanned image data. Applicants have seen about a 30% improvement in defect detection reliability using scanned image data to scanned image data comparison over scanned image data to dataset synthesized image data comparison.

Figure 5:
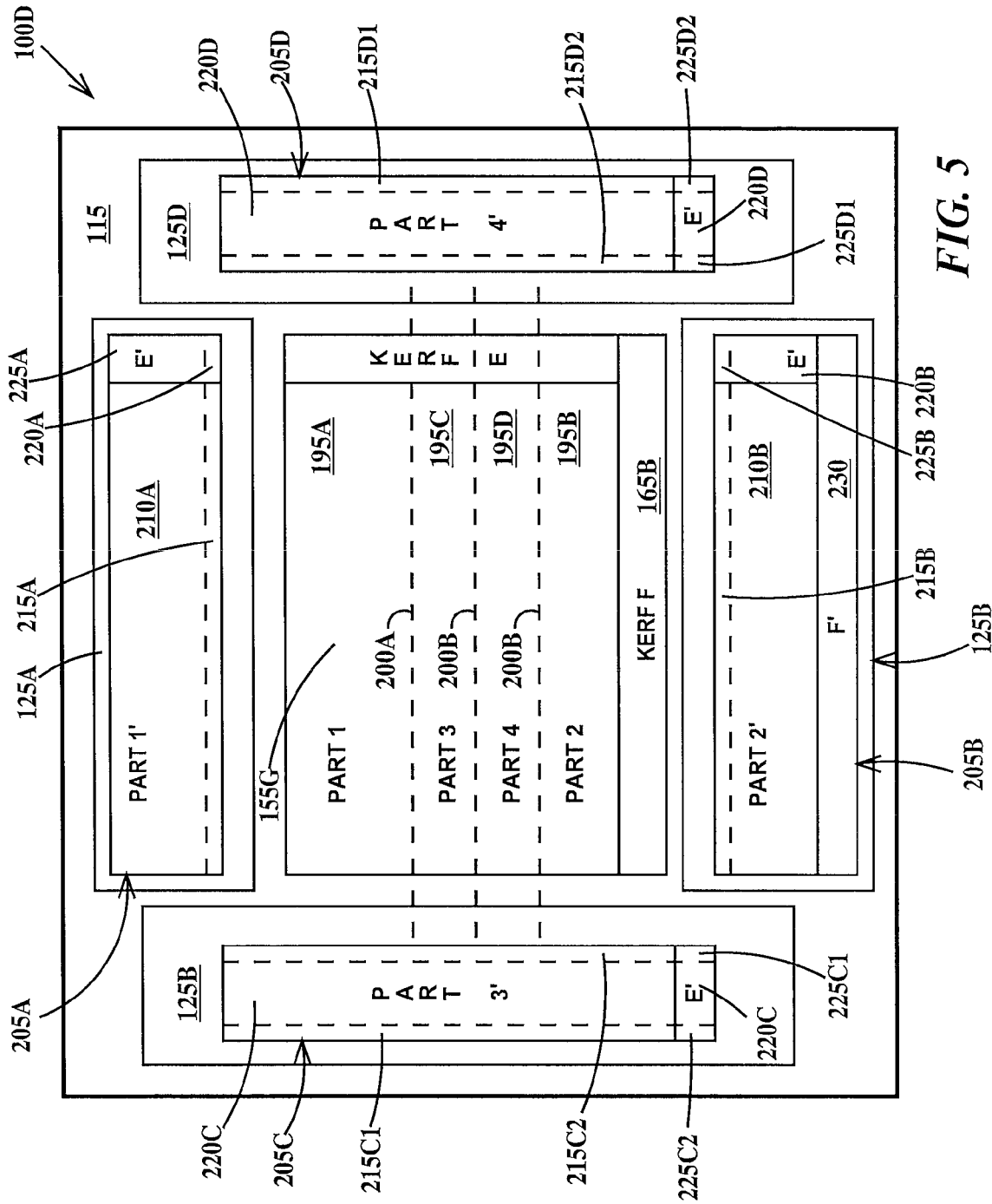
FIG. 5 is a top view of an exemplary photomask illustrating a fifth embodiment of the present invention.

FIG. 5 is a top view of an exemplary photomask illustrating a fifth embodiment of the present invention. In FIG. 5, a photomask 100D is similar to photomask 100C of FIG. 4, except for the following five differences:

First, chip region 155G is divided into first, second, third and fourth partial chip regions 195A, 195B, 195C and 195D by an axes 200A, 200B and 200C which are mutually parallel and parallel to side 105A of photomask 100D.

Second, first extension region 215A includes at least portions of those patterns from adjacent regions of third partial chip region 195C (rather than second region 195B) that extend into first partial chip region 195A and second extension region 225A includes at least portions of those patterns from the portion of first peripheral kerf 165A that overlap axis 200A.

Third, first extension region 215B includes at least portions of those patterns from adjacent regions of fourth partial chip region 195D (rather than first region 195A) that extend into first partial chip region 195A and second extension region 225B includes at least portions of those patterns from the portion of first peripheral kerf 165A that overlap axis 200C.

Fourth, third clear bar 125C contains a third partial printable copy region 205C. Third partial printable copy region 205C includes a third partial chip copy region 210C which includes all the patterns of third partial chip region 195C, a first extension region 215C1 which includes at least portions of those patterns from adjacent regions of first partial chip region 195A that extend into third partial chip region 195C, a second extension region 215C2 which includes at least portions of those patterns from adjacent regions of fourth partial chip region 195D that extend into third partial chip region 195C, a third extension region 225C1 which includes at least portions of those patterns from the portion of first peripheral kerf 165A that overlap axis 200A, and a fourth extension region 225C2 which includes at least portions of those patterns from the portion of first peripheral kerf 165A that overlap axis 200B.

Fifth, fourth clear bar 125D contains a fourth partial printable copy region 205D. Fourth partial printable copy region 205DC includes a fourth partial chip copy region 210D which includes all the patterns of fourth partial chip region 195D, a first extension region 215D1 which includes at least portions of those patterns from adjacent regions of second partial chip region 195B that extend into fourth partial chip region 195D, a second extension region 215D2 which includes at least portions of those patterns from adjacent regions of third partial chip region 195C that extend into fourth partial chip region 195D, a third extension region 225D1 which includes at least portions of those patterns from the portion of second peripheral kerf 165A that overlap axis 200C, and a fourth extension region 225D2 which includes at least portions of those patterns from the portion of first peripheral kerf 165A that overlap axis 200C.

It should be noted that in the fifth embodiment of the present invention in particular but in all embodiments in general, copy regions of cell regions need not be disposed parallel to the cell regions they are copies of but may be rotated 90° from the cell regions they are copies of.

The fourth and fifth embodiments of the present invention may be extended to include photomasks having multiple chip regions that are not identical. In this case, different partial chip regions would include different chip regions, portions of different chip regions or combinations thereof.

Machine defect inspection tools that can perform the various scan, data store, data compare and display steps illustrated in FIG. 6 and described infra are well known in the art. There are two main types of such inspection tools. In a first type, two different regions of the photomask are scanned simultaneously through two lenses and the two images scanned are converted to digital data and compared almost immediately. While there is "data stored: in this type of tool it is relatively minimal. In a second type, a first region is scanned, the images converted to digital data as the scan progresses and the digital data stored. Then a second region is scanned, the images converted to digital data as the scan progresses and the digital data stored. The stored images can then be compared. The second type of tool can also compare scanned images to stored data.

FIG. 6 is a flowchart illustrating a method of inspecting a photomask according to the present invention. In FIG. 6, an inspection tool of the second type as described supra is assumed. In step 300 a photomask according to the present invention is loaded into a mask inspection tool. In step 305, it is determined if the cell region of the photomask has multiple identical chip regions.

If there are multiple identical chip regions then, in step 310, each chip region is scanned and the chip region image scan data is stored. In one examples, scanning is performed by stepping a field of view across a chip in a serpentine pattern, each step comprising a frame of image scan data, each frame of image scan data comprising a three dimensional matrix where the X and Y axis are pixel locations and the Z axis is pixel optical density. Generally, the chip region image scan data is stored as an individual chip region is scanned and the process of scan and store repeated for each chip region. In step 315, the image scan data for all chip regions are compared to one another and differences in the data (exceeding a predetermined threshold difference) for the same area of each chip region noted as potential defects and in step 320, the location or chip region X-Y coordinates of the potential defects is determined. In some machines, the operations of steps 310 and 315 are performed sequentially on sub-regions of each chip region and only the image scan data where potential defects have been detected is stored.

Next, in step 325, the potential defects are verified. When there are only two chip regions, the potential defect location in both chip regions is displayed and a human operator can determine which chip region is defective. When there are three or more chip regions only the non-matching regions (assuming all but one match) potential defect locations need be displayed and the human operator need only determine if an actual defect exist. However, all potential defect locations of all chip regions may be inspected. The locations of actual chip region defects on the photomask are noted for potential repair operations.

Next, in step 330, each kerf copy region is scanned and the kerf copy image scan data is stored. Then, in step 335, each kerf region is scanned and the kerf region image scan data stored. Since kerf copy regions include extension regions containing shapes that extend into adjacent kerf regions as described supra, corresponding extension regions of adjacent kerf regions are scanned as each kerf region is scanned. In step 340, the image scan data for each kerf region is compared to the image scan data for its corresponding kerf copy region and differences in the data (exceeding a predetermined threshold difference) for the corresponding areas of kerf region and kerf copy region are noted as potential defects and, in step 345, the location or kerf and kerf copy region X-Y coordinates of the potential defects are determined. In some machines, the operations of steps 330, 335 and 345 are performed sequentially on corresponding sub-regions of each kerf and corresponding kerf copy region and only the image scan data where potential defects have been detected is stored.

In the case where first and second kerf copies of the same kerf exist, the image scan data of each kerf copy can be compared to image scan data of the kerf. If a same potential defect location occurs in both comparisons there is a high probability that an actual defect exists in that location in the kerf region. If a same potential defect location does not occur in both comparisons then there is a high probability that an actual defect exists in one of the kerf copy regions. A comparison of first kerf copy image data to second kerf image data can conclusively determine if a potential defect exists in the kerf region or one of the kerf copy regions.

Next in step 350, the potential defects are verified. When there is only one kerf copy region, the potential defect location in both the kerf region and its corresponding kerf copy region are displayed and a human operator can determine which chip region is defective. When there are two or more kerf copy regions for a corresponding kerf region only the non-matching region (if its in the kerf region of the cell region) potential defect location need be displayed and the human operator need only determine if an actual defect exist. The locations of actual kerf region defects on the photomask are noted for potential repair operations. Inspection is complete.

Returning to step 300, if there is only one chip region or non-identical chip regions then the method proceeds to step 355. Next, in step 355, each partial copy region is scanned and the partial printable copy region image scan data is stored. Then in step 360 each partial chip region is scanned and the partial chip region image scan data stored. Since each partial chip region includes extension regions containing shapes that extend into adjacent partial chip regions and portions of kerf regions adjacent to the partial chip region and extension region as described supra, corresponding extension regions of adjacent partial chip regions and portions of kerf regions adjacent to the partial chip region and extension region are scanned as each partial chip region is scanned. In step 365, the image scan data for each partial chip region is compared to the image scan data for its corresponding partial copy region and differences in the data (exceeding a predetermined threshold difference) for the corresponding areas of partial chip region and partial copy region are noted as potential defects and, in step 370, the location of partial chip region and partial copy region X-Y coordinates of the potential defects are determined. In some machines, the operations of steps 355, 360 and 365 are performed sequentially on corresponding sub-regions of each partial chip region and corresponding partial printable copy regions and only the image scan data where potential defects have been detected is stored.

Next, in step 375, the potential defects are verified. The potential defect location in both the partial chip region and corresponding adjacent kerf region and its corresponding partial copy region are displayed and a human operator can determine which chip region is defective. The locations of actual partial chip region defects on the photomask are noted for potential repair operations. Inspection is complete.

One of ordinary skill in the art would know the invention is applicable when an inspection tool of the first type is used, by essentially realizing, that with minimal amounts of data storage, steps 310 and 315 are looped, that steps 335 and 340 looped, and that steps 355, 360 and 365 are looped in order to compare regions larger than the field of view of the inspection tool.

Figure 7:
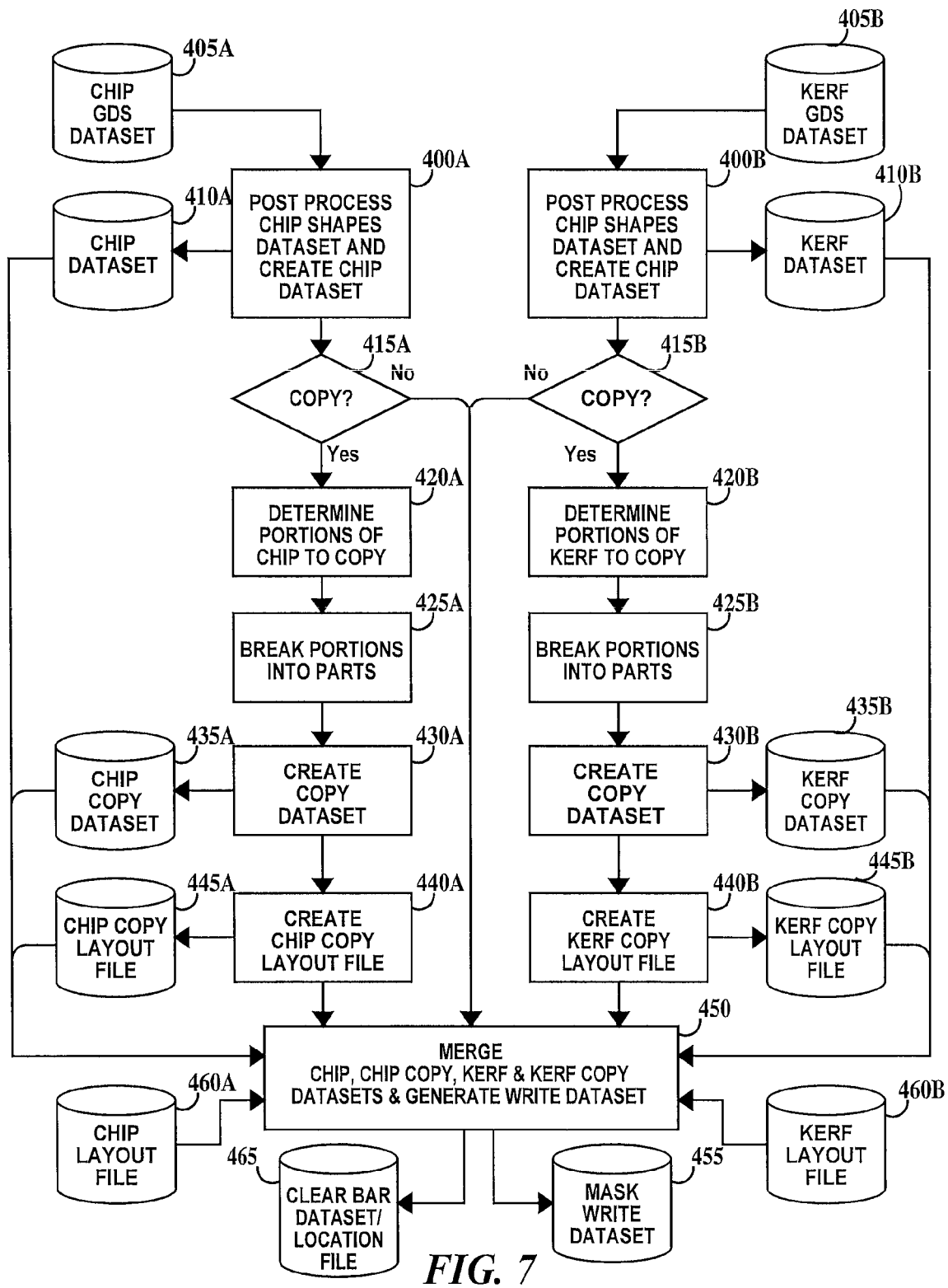
FIG. 7 is a flowchart of a method of designing a photomask according to the present invention.

FIG. 7 is a flowchart of a method of designing a photomask according to the present invention. In step 400A, a chip graphic design system (GDS) dataset (also know as a shapes file) 405A is post processed to add various process and tool compensation to each shape in the GDS dataset 405A to create a post-processed chip dataset 410A. Examples of post processing include optical proximity correction (OPC), process window bias, and NFET/PFET length/width compensation. In step 415A it is determined if a copy of the chip(s) or portions of the chip are required for writing to the clear bars of the photomask. If copies are required, then in step 420A, it is determined which portion of the chip(s) are to be copied and in step 425A, the portions to be copied are broken into parts that will fit into the area of the clear bars and still allow for a clear region between the copy and the frame, at least on the side of the copy adjacent to the cell region. Next, in step 430A, a chip copy dataset 435A is created and, in step 440A, a chip copy layout file 445A is generated. A chip copy layout file indicates where the chip copy is to be written on the photomask (it will be in a clear bar). The method proceeds to step 450. Returning to step 415A, if no chip copies are required the method proceeds to step 450.

In step 400B, a kerf graphic design system (GDS) dataset (also know as a shapes file) 405B is post processed to add various process and tool compensation to each shape in the GDS dataset 405B to create a post-processed kerf dataset 410B. Examples of post processing were given supra. In step 415B it is determined if a copy of the kerf(s) or portions of the kerf are required for writing to the clear bars of the photomask. If copies are required, then in step 420B, it is determined which portion of the kerf(s) are to be copied and in step 425B, the portions to be copied are broken into parts that will fit into the area of the clear bars and still allow for a clear region between the copy and the frame, at least on the side of the copy adjacent to the cell region. Next, in step 430B, a kerf copy dataset 435B is created and, in step 440B, a kerf copy layout file 445B is generated. A kerf copy layout file indicates where the kerf copy is to be written on the photomask (it will be in a clear bar). The method proceeds to step 450. Returning to step 415B, if no kerf copies are required the method proceeds to step 450.

In step 450, a photomask dataset (not shown) is generated from chip dataset 410A, chip copy dataset 435A (if it exists), chip copy layout file 445A (if it exists), a chip layout file 460A, kerf dataset 410B, kerf copy dataset 435B (if it exists), kerf copy layout file 445B (if it exists), a kerf layout file 460B and a clear bar dataset and location file 465. Clear bar dataset and location file 465 indicates the size and location of the clear bars. Step 455 particularly merges kerf copy and chip copy datasets 435A and 435B with clear bar dataset and location file 465. Alternatively, the individual chip, chip copy, chip layout, kerf, kerf copy, kerf layout files and datasets and the clear bar dataset and location file may be considered parts of a larger photomask dataset.

Next, a photomask write dataset 455 is generated by converting the photomask dataset into instructions that can be used to drive a direct write tool (for example, an e-beam tool) used to fabricate a photomask. The opaque frame is defined by default, in that no dataset/location file generates patterns in the frame region outside of the clear bar regions within the frame region.

Figure 8:
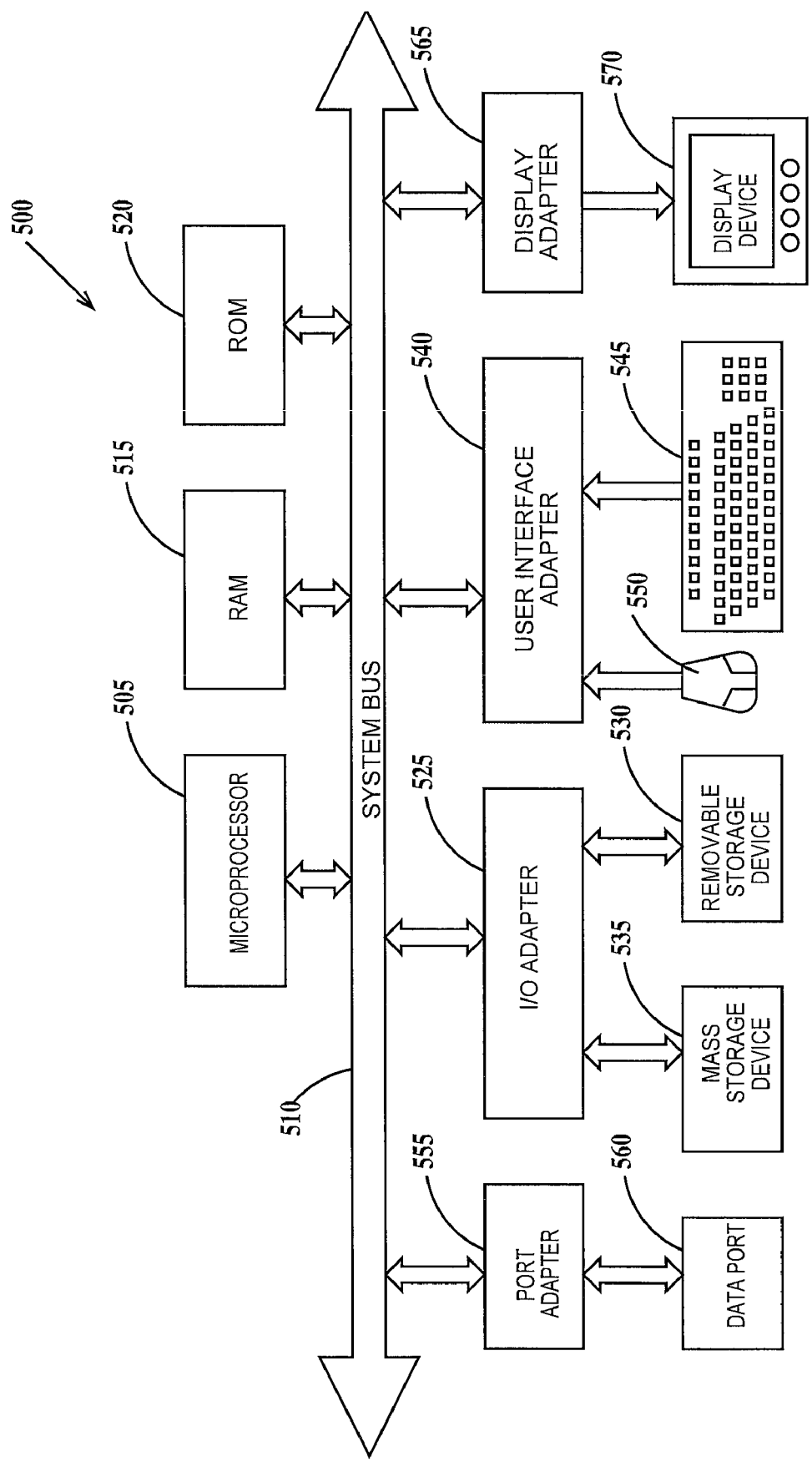
FIG. 8 is a schematic block diagram of a general-purpose computer for use in designing a photomask according to the present invention.

Generally, the method described herein with respect to designing a photomask according to the present invention is practiced with a general-purpose computer and the method may be coded as a set of instructions on removable or hard media for use by the general-purpose computer. FIG. 8 is a schematic block diagram of a general-purpose computer for use in designing a photomask according to the present invention. In FIG. 8, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

Thus, the present invention provides a single machine methodology for inspecting photomasks having regions that repeat and regions that do not repeat.

A computer program with an appropriate application interface may be created by one of skill in the art and stored on the system or a data and/or program storage device to simplify the practicing the photomask design portion of this invention. In operation, information for or the computer program created to run the photomask design portion of present invention is loaded on the appropriate removable data and/or program storage device 530, fed through data port 560 or typed in using keyboard 545.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A photomask, comprising:
    a cell region, said cell region comprising one or more chip regions, each chip region comprising a pattern of opaque and clear sub-regions corresponding to features of an integrated circuit chip and one or more kerf regions, each kerf region comprising a pattern of opaque and clear sub-regions corresponding to features of an integrated circuit kerf;
    an opaque region abutting a perimeter of said cell region; and
    a clear region in said opaque region, a perimeter of said clear region abutted by said opaque region, said clear region surrounding a perimeter of a copy region, said copy region comprising only a pattern of opaque and clear sub-regions that are copies of a pattern of opaque and clear sub-regions of a single contiguous region of said cell region.

2. The photomask of claim 1, further including additional clear regions, perimeters of said additional clear regions abutted by said opaque region, said additional clear regions surrounding respective additional copy regions and wherein said copy region and said additional copy regions include different contiguous portions of a copy of an entire chip region of said one or more chip regions.

3. The photomask of claim 1, wherein said copy region comprises a copy of all or less than a whole portion of a kerf region of said one or more kerf regions.

4. The photomask of claim 3, wherein said clear region further includes an additional copy region, said additional copy region comprising an additional copy of said all or less than a whole portion of said kerf region of said one or more kerf regions.

5. The photomask of claim 1, wherein said copy region comprises a copy of all or less than a whole portion of a kerf region of said one or more kerf regions and a copy of all or less than a whole portion of a chip region of said one or more chip regions.

6. The photomask of claim 1,
wherein said cell region has first, second, third and fourth sides, said first side opposite said second side, said third side opposite said fourth side, said clear region having a side adjacent and parallel to said first side of said cell region; and
further including a second clear region having a side adjacent and parallel to said second side of said cell region, a third clear region having a side adjacent to and parallel to said third side of said cell region and a fourth clear region having a side adjacent and parallel to said fourth side of said cell region.

7. The photomask of claim 6, further including additional copy regions comprising opaque and clear sub-regions that are copies of at least additional parts of said chip region, said additional copy regions disposed within one or more of said second, third and fourth clear regions.

8. The photomask of claim 1,
wherein said cell region has a first side and an opposite second side, said first and second sides each having a same first length, and a third side and an opposite fourth side, said third and fourth sides each having a same second length;
wherein said clear region has a first side having a third length, said first side of said clear region adjacent and parallel to said first side of said cell region; and
wherein said third length is greater than said second length.

9. A method of fabricating a photomask, comprising:
(a) providing a transparent substrate having an opaque coating;
(b) forming a cell region comprising a first pattern of clear and opaque sub-regions by removing first areas of said opaque coating, said cell region comprising one or more chip regions and one or more kerf regions;
(c) forming a copy region comprising a second pattern of clear and opaque sub-regions by removing second areas of said opaque coating, said second pattern of clear and opaque sub-regions consisting of a copy of a single contiguous region of said first pattern of clear and opaque regions;
(d) forming a clear region by completely removing third areas of said opaque coatings, said clear region surrounding a perimeter of said copy region;
wherein after (b), (c) and (d), a contiguous region of said opaque layer remains to form an opaque region completely surrounding said cell region and said clear region;
wherein said clear region is formed between a side of said substrate and a side of said cell region and separated from said cell region by said opaque region; and
wherein a sub-region of said clear region separates said copy region from said opaque region.

10. The method of claim 9, wherein said copy region includes a copy of all or less than a whole portion of a kerf region of said one or more kerf regions.

11. The method of claim 9, further including forming additional clear regions in said opaque regions, perimeters of said additional clear regions abutted by said opaque region, said additional clear regions surrounding respective additional copy regions and wherein said copy region and said additional copy regions include different contiguous portions of a copy of a whole portion of a chip region of said one or more chip regions.

12. The method of claim 9, further including forming additional copy region in said clear region and wherein said copy region includes a copy of all or less than a whole portion of a kerf region of said one or more kerf regions and said additional copy region includes a copy of all or less than a whole portion of a different kerf region of said one or more kerf regions.

13. The method of claim 9, further including forming additional copy region in said clear region and wherein said copy region includes a copy of all or a less than whole portion of said cell region and said additional copy region includes an additional copy of said copy of all or a less than whole portion of said cell region.

14. The method of claim 9, wherein said copy region includes all or less than a whole portion of a kerf region of said one or more kerf regions and all or less than a whole portion of a chip region of said one or more chip regions.

15. The photomask of claim 1, wherein said clear region contains an exact copy of an entire kerf region of said one or more kerf regions.

16. The photomask of claim 1, wherein said cell region includes two or more chip regions, at least one of said one or more kerf regions is an interstitial kerf region between said two of said two or more chip regions and at least one of said one or more kerf regions is a peripheral kerf region abutting a perimeter of said cell region, wherein said copy region contains a copy of said interstitial kerf region; and
further including an additional copy region surrounded by an additional clear region, said additional clear region surrounded by said opaque region, said additional copy region containing of a copy of said peripheral kerf region.

17. The photomask of claim 1, wherein said cell region includes single chip region divided into two or more partial chip regions and a peripheral kerf region abutting a perimeter of said cell region, wherein said copy region contains a copy of said peripheral kerf region; and
further including additional copy regions surrounded by corresponding additional clear regions, said additional clear regions surrounded by said opaque region, said addition copy regions containing copies of a single and different partial chip region of said two or more of partial chip regions.

18. The photomask of claim 17, wherein there is a corresponding additional copy region for each partial chip region of said two or more chip regions.

19. The photomask of claim 1, wherein said clear region contains a first copy of an entire kerf region of said one or more kerf regions and a second copy of said entire kerf region of said one or more kerf regions.

20. The photomask of claim 1, wherein said cell region contains at least two different chip regions and at least two different kerf regions.

21. The method of claim 9, wherein said clear region contains an exact copy of an entire kerf region of said one or more kerf regions.

22. The method of claim 9, wherein said cell region includes two or more chip regions, at least one of said one or more kerf regions is an interstitial kerf region between said two of said two or more chip regions and at least one of said one or more kerf regions is a peripheral kerf region abutting a perimeter of said cell region, wherein said copy region comprises a copy of said interstitial kerf region; and
further including an forming an additional copy region surrounded by an additional clear region, said additional clear region surrounded by said opaque region, said additional copy region containing of a copy of said peripheral kerf region.

23. The method of claim 9, wherein said cell region includes single chip region divided into two or more partial chip regions and a peripheral kerf region abutting a perimeter of said cell region; wherein said copy region comprises a copy of said peripheral kerf region; and further including forming additional copy regions surrounded by corresponding additional clear regions, said additional clear regions surrounded by said opaque region, said addition copy regions containing copies of a single and different partial chip region of said two or more of partial chip regions.

24. The method of claim 23, further including forming a corresponding additional copy region for each partial chip region of said two or more chip regions.

25. The method of claim 9, wherein said clear region includes a first copy of an entire kerf region of said one or more kerf regions and a second copy of said entire kerf region of said one or more kerf regions.

26. The method of claim 9, wherein said cell region contains at least two different chip regions and at least two different kerf regions.

* * * * *